United States Patent [19]

Mumola

[11] Patent Number: 5,419,803
[45] Date of Patent: May 30, 1995

[54] METHOD OF PLANARIZING MICROSTRUCTURES

[75] Inventor: Peter B. Mumola, Huntington, Conn.

[73] Assignee: Hughes Aircraft Company, Los Angeles, Calif.

[21] Appl. No.: 153,681

[22] Filed: Nov. 17, 1993

[51] Int. Cl.⁶ .......................... B44C 1/22; C03C 15/00
[52] U.S. Cl. ............................ 216/38; 216/59; 216/67
[58] Field of Search ............. 156/636, 643, 657, 626; 204/192.37, 192.33; 437/228; 356/355

[56] References Cited

U.S. PATENT DOCUMENTS 4,680,084 7/1987 Heimann et al. .................. 156/626
5,272,115 12/1993 Sato ................................... 437/228
5,296,092 3/1994 Kim .................................... 156/643

*Primary Examiner*—William Powell
*Attorney, Agent, or Firm*—W. C. Schubert; W. K. Denson-Low

[57] ABSTRACT

A method of planarizing a microstructure (16) includes the steps of providing a layer (18) of material over the microstructure (16) such that an overcoating surface (20) is formed, measuring the thickness of the layer (18) across the surface (20) forming a dwell time versus position map and removing material from the layer (18) of material by use of a plasma assisted chemical etching tool in accordance with the dwell time versus position map.

9 Claims, 1 Drawing Sheet

METHOD OF PLANARIZING MICROSTRUCTURES

BACKGROUND OF THE INVENTION

The present invention generally relates to a method of planarizing microstructures and, in particular, relates to one such method including the step of subjecting a microstructure having a planarization layer thereon to a plasma assisted chemical etching step.

During the present manufacture of microstructures, such as integrated circuits, it is customary to form a structure in, or on, a surface and subsequently, usually in anticipation of another fabrication step, form a plane layer of material over the structure so that the following fabrication step can be performed on a smooth flat surface. Further, the planarization layer of material serves as an electrical, and or thermal, insulation between the structures. Typically, the process can be repeated a number of times throughout the fabrication of an integrated circuit.

Currently, the final planarization step is performed by the physical and or chemical, polishing of a self-leveling coating. That is, the microstructure is covered by a planarization layer of material such that the microstructure is completely covered and the exposed surface of the material is relatively smooth. The planarization layer of material is then physically and/or chemically polished by use of conventional and commercially available equipment. This conventional method has numerous drawbacks. For example, the actual polishing, regardless of whether it is performed by physical polishing, conventional chemical etching or reactive ion etching, generally leaves defects in the surface of the self-leveling layer of material that reduce the accuracy of subsequent processing steps, thereby reducing the overall yield of the manufacturing process. Further, conventional chemical and mechanical techniques result in non-uniform thickness in the final film. In addition, particularly in the field of modem integrated circuit fabrication, these conventional processes can be a source of particulate contamination that can significantly reduce the yield of the integrated circuit manufacturing process. Clearly, the common detraction of conventional polishing processes is that physical contact with the self-leveling material is required. Further, the material of the self-leveling layer must be chosen with great care to ensure its compatibility with the requisite temperatures and materials to which it is exposed during the subsequent processes.

Hence, a method of planarizing microstructures that is accurate and clean is highly desirable in the general industry of microstructures and extremely desirable in the particular field of integrated circuit and semiconductor manufacturing.

SUMMARY OF THE INVENTION

Accordingly, it is one object of the present invention to provide a method of planarizing a microstructure that substantially completely overcomes the above-recited drawbacks of conventional processes.

This object is accomplished, at least in part, by the provision of a method of planarization including the step of subjecting a microstructure having a planarization layer thereon to a non-contact plasma assisted chemical etching step such that surface contamination is reduced and a comparatively smooth surface is provided for subsequent processing steps.

Other objects and advantages will become apparent to those skilled in the art from the following detailed description of the invention read in conjunction with the appended claims and the drawings attached hereto.

BRIEF DESCRIPTION OF THE DRAWINGS

The drawings, not drawn to scale, include.

DETAILED DESCRIPTION OF THE INVENTION

Figure 1A:
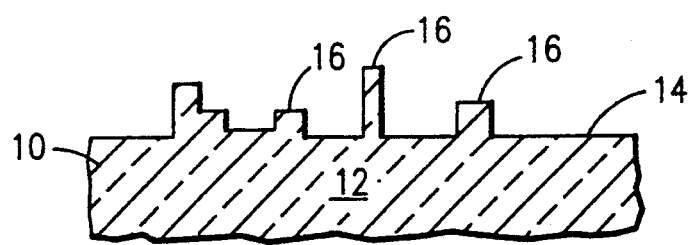
FIGS. 1A–1C which are cross-sectional views of a microstructure at different stages during the performance of a method for planarizing a layer of material and embodying the principles of the present invention.
Figure 1B:
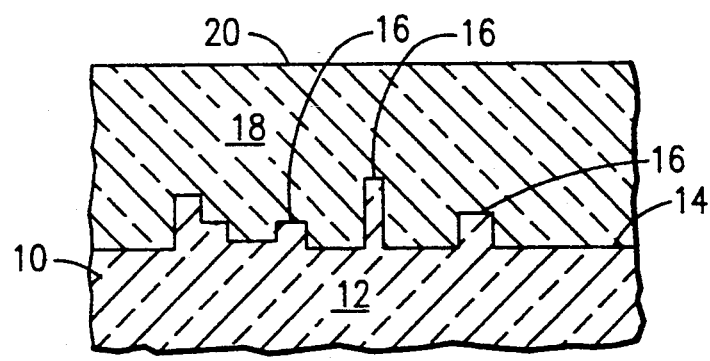
Figure 1C:
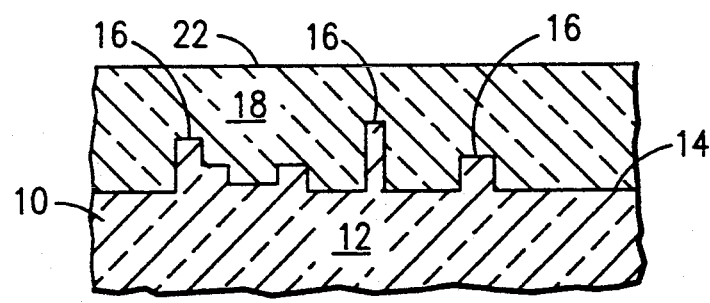

A method embodying the principles of the present invention is generally depicted in FIGS. 1A through 1C. As shown in FIG. 1A, the initial workpiece upon which the present method can be performed is a microstructure 10. As used herein the term microstructure, as well as any idiomatic variation thereof, is intended to contemplate surface relief features much smaller than that of the substrate dimensions, typically less than one millimeter laterally and vertically.

As shown in the exemplary embodiment of FIG. 1A, the microstructure 10 includes a substrate 12 having a surface 14 upon which a plurality of features 16 are formed. In one preferred embodiment, the substrate 12 is a semiconductor wafer. Further, in such an embodiment, the features 16 on the surface 14 thereof can be various elements of an integrated circuit device. In one particular embodiment, the height of the features 16 varies between 0.001 micrometers and 1.0 micrometers as measured with respect to the surface 14 of the substrate 12.

In the embodiment shown in FIG. 1B, a planarization layer 18 is formed on the surface 12 such that all of the features 16 are overcoated and a relatively planar surface 20 is established. Typically, the planarization layer 18 can be formed by known thick film semiconductor manufacturing techniques. In one preferred embodiment, the layer 18 is an oxide, such as silicon dioxide, formed by conventional chemical vapor deposition techniques. As more fully discussed below, the layer 18 of material can, by use of the present method, be formed to a thickness relatively greater than thicknesses used in conventional techniques. The ability to provide a layer 18 of material of increased thickness is advantageous because thicker layers generally yield more planar top surfaces which reveal none of the underlying surface relief. Once the layer 18 of planarization material is disposed over the surface 14 and the relatively planar surface 20 is established, the microstructure 10 is subjected to an analysis for measuring the thickness of the layer 18 across the surface 20 thereof. Of particular interest is the thickness of the layer 18 with respect to the feature 16 having the greatest height with respect to the surface 12, i. e., the thinnest portion of the layer 18 and thus that feature 16 will limit the depth to which material can be removed. Typically, for example, in the instance where the microstructure 10 is a semiconductor device, the layer 18 is not removed to expose any of the features 16, but is thinned to enable a subsequent processing step to be performed over the existing features 16 without undue interference. Typically, in the embodiment wherein the microstructure 10 is a semiconductor integrated circuit, a minimum of zero to 0.05 micrometers, as measured with respect to the feature 16 having the greatest height above the surface 12, of the layer 18 of overcoat material is left for subsequent fabrication processes.

Numerous measurement techniques are available for performing the thickness profile measurements across the surface 20 of the layer 18 of overcoating material. For example, one technique involves the use of a spectrometer that computes the thickness at each point of the surface 20 on a point-by-point basis from the spectral reflectance signature. The thickness profile data can also be determined from such instruments as an ellipsometer, or a high frequency acoustic wave device. One of the primary criteria for selecting the thickness profile measuring device is the operating wavelength thereof must be within the transparency range of the layer 18 of material. For example, if the material of the layer 18 is silicon dioxide the visible wavelength spectral reflectometer has an advantage because many points can be rapidly measured to map the thickness profile data. The measuring step can be accomplished by translating the thickness profile measuring instrument and the workpiece with respect to each other. Alternatively, because the approximate location of the feature 16 having the greatest height with respect to the surface 12 is known to some degree, a lesser number of point measurements can be used during the measuring step than if the point measurements were required for a full surface analysis task without such information.

However, in the preferred embodiment, the thickness profile of the layer 18 of overcoating material is determined by use of a full surface imaging spectral reflectometer such as that described in U.S. patent application Ser. No. 07/804,872, filed on Dec. 6, 1991, now U.S. Pat. No. 5,333,047, entitled Apparatus And Method For Measuring The Thickness Of Thin Films assigned to the assignee hereof, the teachings of which are hereby incorporated herein by reference. Therein an apparatus is described which, in one embodiment thereof, in essence, directs a surface image onto a charge-coupled device camera. The image is then digitized for comparison with a set of stored spectral reflectance signature corresponding to know layer thicknesses and provides a thickness profile map of the surface film layer.

The thickness profile map of the layer 18 of overcoating material is then used to form a dwell time versus position map such as that described in U.S. patent application Ser. No. 07/696,897 filed on May 7, 1991, U.S. Pat. No. 5,254,830 entitled System For Removing Material From A Wafer and assigned to the assignee hereof, the teachings of which are hereby incorporated herein by reference. As described therein, a system for removing material is contemplated wherein a plasma assisted chemical etching tool is controlled in accordance with a dwell time versus position map to remove material from a wafer. Such a plasma system is a noncontact method of removing material. That is, the materials of the plasma are chosen so that a chemical reaction occurs between the plasma generated reactants and the material being etched. As a result, the surface 22 of the layer 18 of material that is exposed during the processing is undamaged by the process itself. This characteristic is particularly useful is conjunction with the removal of the layer 18 of overcoat material since the surface 22 exposed during the etching is likely to be used as a basis for subsequent processing steps. In fact, it has been found that the surface 22 exposed during plasma assisted chemical etching has little thickness variation thereacross. Consequently, the surface 22 exposed during the plasma etching provides an excellent basis upon which subsequent fabrication processes are performed.

Although the present invention has been described herein with respect to various arrangements and steps it will be understood that other configurations and arrangements may be implemented by those skilled in the art which do not depart from the spirit and scope hereof. Hence, the present invention is deemed limited only by the appended claims and the reasonable interpretation thereof.

What is claimed is:

1. A method of planarizing a microstructure having a plurality of features extending from a surface thereof, said method comprising the steps of:
   providing a layer of material over said microstructure such that an overcoating surface is formed;
   measuring the thickness of said layer across the surface thereof;
   forming a dwell time versus position map for said surface; and
   removing material from said layer of material by use of a plasma assisted chemical etching tool, said material removal being in accordance with said dwell time versus position map.

2. The method as claimed in claim 1 wherein said layer providing step is carried out until all of said features are overcoated.

3. The method as claimed in claim 1 wherein said layer providing step includes the step of depositing material on said microstructure to establish said layer of material over said microstructure.

4. The method as claimed in claim 3 wherein said layer providing step includes forming said layer to a minimum thickness of about one to five micrometers.

5. The method as claimed in claim 1 wherein said measuring step includes the step of computing the thickness of a plurality of points of said surface.

6. The method as claimed in claim 1 wherein said measuring step includes the step of computing the thickness of said plurality of points on a point-by-point basis.

7. The method as claimed in claim 6 wherein said measuring step includes the step of computing the thickness of said surface by use of a full surface imaging spectral reflectometer.

8. The method as claimed in claim 1 wherein said layer providing step includes depositing a material that is transparent to said full surface interferometer.

9. The method as claimed in claim 1 wherein said material removal step includes removing material from said layer so that a minimum of between zero and 0.05 micrometers remains over a feature that is greatest in height above said surface of said microstructure.

* * * * *